United States Patent
Zhou et al.

(10) Patent No.: US 10,018,750 B2
(45) Date of Patent: Jul. 10, 2018

(54) DISPLAY SUBSTRATE WITH PIXEL UNITS IN A MATRIX ARRAY AND DISPLAY DEVICE

(71) Applicants: BOE Technology Group Co., Ltd., Beijing (CN); Beijing BOE Display Technology Co., Ltd., Beijing (CN)

(72) Inventors: Bo Zhou, Beijing (CN); Xiaodong Zhou, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/511,328

(22) PCT Filed: Apr. 14, 2016

(86) PCT No.: PCT/CN2016/079264
§ 371 (c)(1),
(2) Date: Mar. 15, 2017

(87) PCT Pub. No.: WO2016/197698
PCT Pub. Date: Dec. 15, 2016

(65) Prior Publication Data
US 2017/0285223 A1    Oct. 5, 2017

(30) Foreign Application Priority Data
Jun. 10, 2015    (CN) .......................... 2015 1 0317087

(51) Int. Cl.
*G02B 3/08*    (2006.01)
*H01L 51/52*   (2006.01)

(52) U.S. Cl.
CPC ............ *G02B 3/08* (2013.01); *H01L 51/5275* (2013.01)

(58) Field of Classification Search
None
See application file for complete search history.

(56) References Cited

U.S. PATENT DOCUMENTS

| | | | |
|---|---|---|---|
| 6,809,470 B2 | 10/2004 | Moreley et al. | |
| 7,091,652 B2 | 8/2006 | Moreley et al. | |
| (Continued) | | | |

FOREIGN PATENT DOCUMENTS

| | | |
|---|---|---|
| CN | 1525214 A | 9/2004 |
| CN | 1528021 A | 9/2004 |
| (Continued) | | |

OTHER PUBLICATIONS

First Office Action from Chinese Patent Application No. 201510317087.X, dated Jun. 27, 2017, 14 pages.
(Continued)

*Primary Examiner* — Bilkis Jahan
(74) *Attorney, Agent, or Firm* — Westman, Champlin & Koehler, P.A.

(57) ABSTRACT

The present disclosure provides a display substrate and a method of manufacturing the same, and a display device. The display substrate comprises a base substrate and a pixel layer disposed on the base substrate, the pixel layer comprising a plurality of pixel units distributed in a matrix array. The display substrate further comprises a Fresnel lens layer including a plurality of Fresnel lenses. The pixel units each are located at a position within a focal plane of at least one of the Fresnel lenses.

15 Claims, 2 Drawing Sheets

(56) References Cited

U.S. PATENT DOCUMENTS

| | | |
|---|---|---|
| 7,733,019 B2 | 6/2010 | Song et al. |
| 8,085,350 B2 | 12/2011 | Miyazaki et al. |
| 8,446,535 B2 | 5/2013 | Miyazaki et al. |
| 2004/0169920 A1 | 9/2004 | Uehara et al. |
| 2006/0139953 A1 | 6/2006 | Chou et al. |
| 2008/0218461 A1* | 9/2008 | Sugita ............... G02F 1/133621 345/88 |
| 2009/0190096 A1* | 7/2009 | Chen ................... G02B 27/2214 353/7 |
| 2011/0128621 A1 | 6/2011 | Uehara et al. |
| 2012/0314143 A1* | 12/2012 | Shin ........................ B32B 37/02 349/15 |
| 2012/0327199 A1* | 12/2012 | Chen .................. G02B 27/2214 348/51 |
| 2013/0271714 A1* | 10/2013 | Hirota ................... G02F 1/1339 349/139 |
| 2013/0335649 A1* | 12/2013 | Mather ................. G02F 1/1323 349/15 |
| 2013/0342664 A1* | 12/2013 | Smith ................ G02B 27/2214 348/58 |
| 2014/0034919 A1 | 2/2014 | Park et al. |
| 2014/0043680 A1 | 2/2014 | Uehara et al. |
| 2015/0091045 A1* | 4/2015 | Chang ................. H01L 51/5246 257/100 |
| 2015/0290072 A1 | 10/2015 | Singhal |
| 2016/0238747 A1* | 8/2016 | Huang ..................... G02B 3/08 |

FOREIGN PATENT DOCUMENTS

| | | |
|---|---|---|
| CN | 1691857 A | 11/2005 |
| CN | 101387757 A | 3/2009 |
| CN | 101526688 A | 9/2009 |
| CN | 104900683 A | 9/2015 |
| WO | 2014/033699 A2 | 3/2014 |
| WO | 2014033633 A2 | 3/2014 |

OTHER PUBLICATIONS

International Search Report (English translation) and Written Opinion of International Application No. PCT/CN2016/079264, dated Jul. 22, 2016, 7 pages.

English translation of Box No. V of the Written Opinion for the International Searching Authority for International Application No. PCT/CN2016/079264, 2 pages.

Second Office Action from Chinese Patent Application No. 201510317087.X, dated Dec. 26, 2017, 10 pages.

* cited by examiner

DISPLAY SUBSTRATE WITH PIXEL UNITS IN A MATRIX ARRAY AND DISPLAY DEVICE

CROSS-REFERENCE TO RELATED APPLICATIONS

This application is a Section 371 National Stage Application of International Application No. PCT/CN2016/079264, filed on Apr. 14, 2016, entitled "display substrate and method of manufacturing the same, and display device", which claims priority to Chinese Application No. 201510317087.X, filed on Jun. 10, 2015, incorporated herein by reference in their entirety.

BACKGROUND

1. Technical Field

The present disclosure relates to display technology field, and particularly to a display substrate and a method of manufacturing the same, and a display device.

2. Description of the Related Art

An organic light-emitting diode (OLED) display device does not need any backlight source as its pixel units may own emit light, and thus become hot point of research and development on a new generation of display technology.

SUMMARY

It is objective to provide a display substrate and a method of manufacturing the same and a display device including the display substrate. In the display substrate, convergence or divergence of light emitted by pixel units may be achieved, and thus high-brightness display of the display substrate may be achieved or light of the display substrate may be distributed more evenly such that a viewer may obtain similar visual sense in a greater viewing angle range.

Embodiments of the present disclosure provide a display substrate comprising a base substrate and a pixel layer disposed on the base substrate, the pixel layer comprising a plurality of pixel units distributed in a matrix array;

wherein the display substrate further comprises a Fresnel lens layer including a plurality of Fresnel lenses; and the pixel units each are located at a position within a focal plane of at least one of the Fresnel lenses.

Optionally, each of the pixel units comprises a plurality of sub-pixels, and each of the sub-pixels corresponds to one of the Fresnel lenses and is located at a position within the focal plane of the corresponding Fresnel lens.

Optionally, each of the Fresnel lenses is equivalent to a concave lens or a convex lens.

Optionally, the Fresnel lens layer is disposed on the pixel layer and a packaging substrate is provided on the Fresnel lens layer.

Optionally, a packaging substrate is provided on the pixel layer and the Fresnel lens layer is provided on the packaging substrate.

Optionally, the display substrate further comprises a protective layer on a side of the Fresnel lens layer apart from the packaging substrate and a material of the protective layer has a refractive index not less than a refractive index of a material of the Fresnel lenses.

Optionally, the display substrate further comprises sealing glue used for sealing the base substrate and the packaging substrate; wherein the sealing glue is located around the pixel layer.

Optionally, the Fresnel lens layer comprises a plurality of Fresnel lenses and each of the Fresnel lenses comprises:

a plurality of concentric circles at one side of the Fresnel lens layer, the plurality of concentric circles comprising an elliptical arc surface at a central position and projections located between two adjacent ones of concentric circles; and a flat surface located at the other side of the Fresnel lens layer opposite to the side of the Fresnel lens layer.

Optionally, each of the projections comprises a sawtooth-shaped arc surface, and the elliptical arc surface and the sawtooth-shaped arc surface together form a curved surface of the concave lens or the convex lens.

Optionally, a vertical cross section of each of the projections includes two lateral sides of an isosceles triangle and an angular bisector of an apex angle between the two lateral sides of the isosceles triangle is perpendicular to the Fresnel lens layer.

Embodiments of the present disclosure provide a method of manufacturing a display substrate, the method comprising:

coating a transparent resin on a base substrate, on which a pixel layer is provided, so as to form a transparent resin layer, a refractive index of the transparent resin layer being greater than a refractive index of the pixel layer;

forming a Fresnel lens layer by performing a mold-pressing process on the transparent resin layer by using a mold that has a shape corresponding to a shape of a Fresnel lens;

coating sealing glue on the base substrate on which the Fresnel lens layer is formed, the sealing glue being located around the pixel layer; and assembling the base substrate which is coated with the sealing glue and the packaging substrate.

Embodiments of the present disclosure provide a method of manufacturing a display substrate, the method comprising:

coating sealing glue on a base substrate on which a pixel layer is formed, the sealing glue being located around the pixel layer;

assembling a packaging substrate and the base substrate which is coated with the sealing glue; and attaching a Fresnel lens layer onto the packaging substrate.

Optionally, before attaching a Fresnel lens layer onto the packaging substrate, the method further comprises: forming the Fresnel lens layer and forming a protective layer on the Fresnel lens layer.

Embodiments of the present disclosure provide a display device comprising the display substrate as described above.

DETAILED DESCRIPTION OF THE EMBODIMENTS

Further description of the present disclosure in detailed will be made with reference to the drawings and embodiments in order to understand the schemes of the present disclosure better by those skilled in the art.

Figure 1:
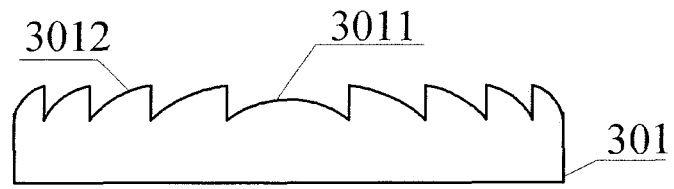
FIG. 1 is a structural schematic view of a Fresnel lens in prior art which is equivalent to a convex lens.
Figure 2:
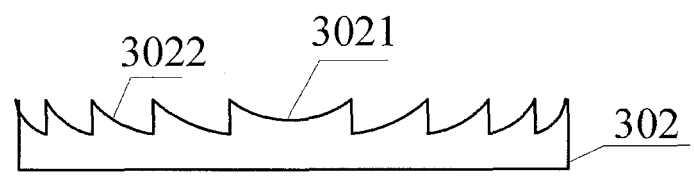
FIG. 2 is a structural schematic view of a Fresnel lens in prior art which is equivalent to a concave lens.

Fresnel lens may render light from a light source to be converged, paralleled or diverged. Generally, the Fresnel lens may be classified into Fresnel lens 301, as shown in FIG. 1, which is equivalent to a convex lens, and Fresnel lens 302, as shown in FIG. 2, which is equivalent to a concave lens. The Fresnel lens 301, which is equivalent to a convex lens, is capable of cause light from a light source to be converged or paralleled. The Fresnel lens 302, which is equivalent to a concave lens, is capable of cause a light from a light source to be diverged.

As shown in FIG. 1 (or FIG. 2), the Fresnel lens includes: a plurality of concentric circles at a side thereof, the plurality of concentric circles including a first elliptical arc surface 3011 (or second elliptical arc surface 3021) at the center and first projections 3012 (or second projections 3022) between two adjacent concentric circles; and a flat surface at the other side thereof opposite to the side.

As shown in FIG. 1, the first elliptical arc surface 3011 and the first projections 3012 of the Fresnel lens 301, which is equivalent to a convex lens, form a curved surface of the convex lens. When light is incident from a focal point below, the Fresnel lens 301, which is equivalent to a convex lens, causes emergent light to be converged or paralleled.

As shown in FIG. 2, the second elliptical arc surface 3021 and the second projections 3022 of the Fresnel lens 302, which is equivalent to a concave lens, form a curved surface of the concave lens. When light is incident from a virtual focus below, the Fresnel lens 302, which is equivalent to a concave lens, causes emergent light to be diverged (i.e., a reverse extension line of the emergent light is converged to the virtual focus).

Figure 3:
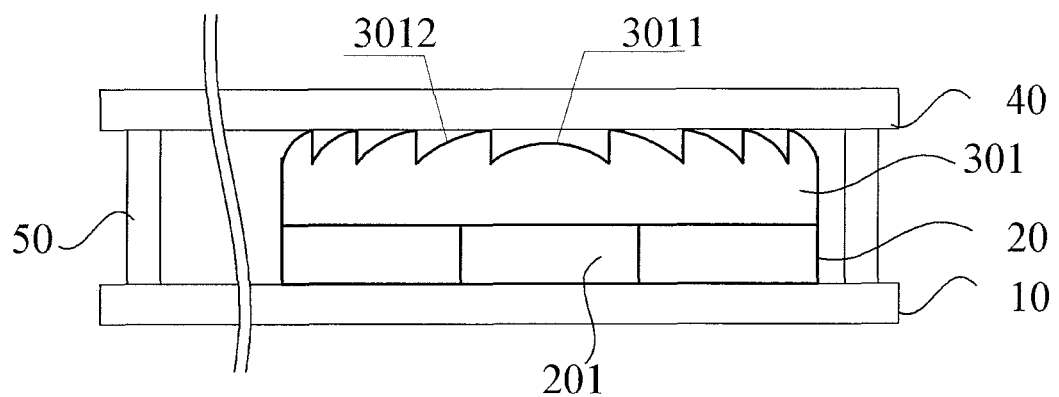
FIG. 3 is a structural schematic view of a display substrate according to an embodiment and another embodiment of the present disclosure, in which a Fresnel lens layer which is equivalent to a convex lens is dispose on a pixel layer.
Figure 4:
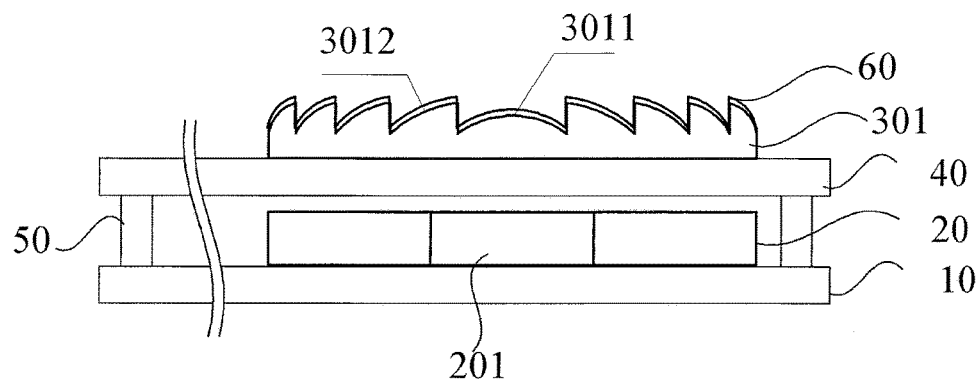
FIG. 4 is a structural schematic view of a display substrate according to an embodiment and still embodiment of the present disclosure, in which a Fresnel lens layer which is equivalent to a convex lens is dispose on a packaging substrate.
Figure 5:
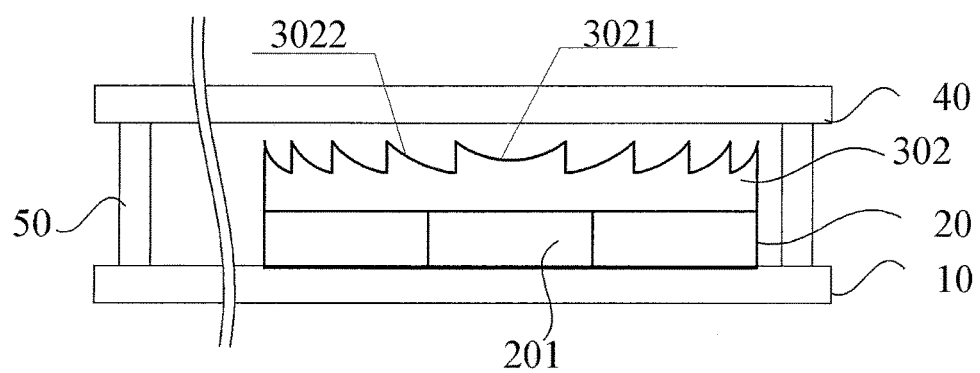
FIG. 5 is a structural schematic view of a display substrate according to an embodiment of the present disclosure, in which a Fresnel lens layer which is equivalent to a concave lens is dispose on a pixel layer.

As shown in FIGS. 3 to 5, the embodiment provides a display substrate, comprising a base substrate 10 and a pixel layer 20 disposed on the base substrate 10, the pixel layer 20 comprising a plurality of pixel units distributed in a matrix array;

In an example, the display substrate further comprises a Fresnel lens layer including a plurality of Fresnel lenses; and the pixel units each are located at a position within a focal plane of at least one of the Fresnel lenses.

The Fresnel lens layer may include a plurality of Fresnel lenses such that each of the pixel units is located at a position within a focal plane of at least one of the Fresnel lenses of the Fresnel lens layer.

It is understood that the Fresnel lens layer means a layer where the Fresnel lens is located. For example, in FIGS. 3 and 4, the Fresnel lens layer means a layer where the Fresnel lens 301 that is equivalent to a convex lens is located; in FIG. 5, the Fresnel lens layer means a layer where the Fresnel lens 302 that is equivalent to a concave lens is located.

As the display substrate is provided with the Fresnel lens layer and the pixel units are each located at a position within the focal plane of at least one of the Fresnel lens of the Fresnel lens layer, light from each of the pixel units can be converged or diverged and thus high-brightness display can be obtained by the display substrate or lighting of the display substrate can be distributed evenly, thereby enabling a viewer to obtain similar visual sense in a greater viewing angle range.

It is understood that the focal plane is equivalent to a plane where a focal point of the Fresnel lens 301, which is equivalent to a convex lens, is located, or is equivalent to a plane where a virtual focus of the Fresnel lens 302, which is equivalent to a concave lens, is located.

Optionally, each of the pixel units includes a plurality of sub-pixels 201, and each of the sub-pixels 201 corresponds to one of the Fresnel lenses and is located at a position within the focal plane of the corresponding Fresnel lens.

It is understood that, generally, each of the pixel units includes three sub-pixels 201 including red, green and blue sub-pixels. Of course, each of the pixel units may also include more sub-pixels 201 of other types in prior art. As each of the pixel units 201 is located at a position within the focal plane of the corresponding Fresnel lens, light emitted by the each of the pixel units 201 can be transformed into converged light, parallel light or diverged light after passing though the corresponding Fresnel lens.

Optionally, the Fresnel lens is equivalent to a concave lens or a convex lens.

As such, when the Fresnel lens is equivalent to a convex lens, light from each of the pixel units 201 is transformed by the Fresnel lens to be converged or paralleled, thereby high-brightness display of the sub-pixels being achieved. When the Fresnel lens is equivalent to a concave lens, light from each of the pixel units 201 is transformed by the Fresnel lens to be diverged, thereby light of each of the sub-pixel 201 being distributed more evenly and a viewer obtaining similar visual sense in a greater viewing angle range.

As shown in FIG. 3, optionally, the Fresnel lens layer (i.e., a layer where the Fresnel lens 301, which is equivalent to a convex lens, is located) is disposed on the pixel layer 20. A packaging substrate 40 is provided on the Fresnel lens layer.

Specifically, the Fresnel lens layer is located inwardly with relative to the packaging substrate 40. In this configuration, the Fresnel lens layer may be manufactured directly on the pixel layer 20 by a mold-pressing method.

Further, as shown in FIG. 4, optionally, a packaging substrate 40 is provided on the pixel layer 20. The Fresnel lens layer (i.e., a layer where the Fresnel lens 301, which is equivalent to a convex lens, is located) is disposed on the packaging substrate 40. In this configuration, the Fresnel lens layer may be formed separately, and then is attached onto the packaging substrate 40.

As shown in FIG. 4, optionally, the display substrate further includes a protective layer 60 at a side of the Fresnel lens layer apart from the packaging substrate 40. The protective layer 60 may be formed from a material with a refractive index not less than a refractive index of a material for forming the Fresnel lenses (i.e., material for forming the Fresnel lens layer).

As such, as the Fresnel lens layer is located outside of the packaging substrate 40, the protective layer 60 may function to protect the Fresnel lens layer. Meanwhile, as the refractive index of the material for forming the protective layer 60 is not less than the refractive index of a material for forming the Fresnel lenses, a total reflection of light at an interface between the Fresnel lens layer and the protective layer 60 may be prevented when the light is incident from the Fresnel lens layer to the protective layer 60, such that light from the pixel layer 20 may be refracted and emitted out of the protective layer 60.

Optionally, the display substrate may further include sealing glue 50 for sealing the base substrate 10 and the packaging substrate 40; and the sealing glue is located at a periphery of the pixel layer 20.

By this way, the base substrate 10 and the packaging substrate 40 are sealed by the sealing glue 50, thereby forming a display substrate.

As shown in FIG. 3 to FIG. 7, optionally, the Fresnel lens layer includes: a plurality of Fresnel lenses and each of the Fresnel lenses includes a plurality of concentric circles at a side of the Fresnel lens layer, the plurality of concentric circles comprising a elliptical arc surface at the center and projections located between two adjacent concentric circles; and a flat surface located at the other side of the Fresnel lens layer opposite to the side.

It is understood that the Fresnel lens composed of the above plurality of concentric circles may cause the light incident from a side of the flat surface to be converged or paralleled when being equivalent to a convex lens, or may cause the light incident from a side of the flat surface to be diverged when being equivalent to a concave lens.

Optionally, the projection include a sawtooth-shaped arc surface, and the sawtooth-shaped arc surface and the elliptical arc surface together form a curved surface of the concave lens or the convex lens.

It is understood that the elliptical arc surface and the sawtooth-shaped arc surface have a common focal point when the Fresnel lens is equivalent to the convex lens, so as to achieve convergence or parallelism of the light emitted from the pixel units, or the elliptical arc surface and the sawtooth-shaped arc surface have a common virtual focus when the Fresnel lens is equivalent to the concave lens, so as to achieve divergence of the light emitted by the pixel units.

Figure 6:
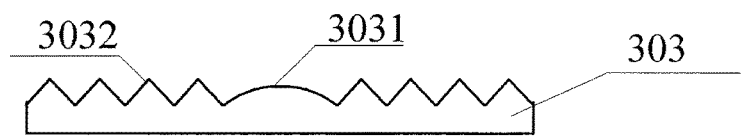
FIG. 6 is a structural schematic view of the Fresnel lens, which is equivalent to a convex lens and has a simplified structure, according to an embodiment of the present disclosure.
Figure 7:
FIG. 7 is a structural schematic view of the Fresnel lens, which is equivalent to a concave lens and has a simplified structure, according to an embodiment of the present disclosure.

Optionally, for example, as shown in a schematic cross section view in FIGS. 6 and 7, the projections may be considered to include two lateral sides of an isoceles triangle, and an angular bisector of an apex angle between the two lateral sides of the isosceles triangle is perpendicular to the Fresnel lens layer. In other words, a vertical cross section of the projection includes two lateral sides of an isoceles triangle, and an angular bisector of an apex angle between the two lateral sides of the isosceles triangle is perpendicular to the Fresnel lens layer. Herein, the angular bisector being perpendicular to the Fresnel lens layer means the angular bisector is perpendicular to a plane where the Fresnel lens layer is located.

It is understood that, in a situation where the projection is formed by two lateral sides of the isosceles triangle, a focal length of the projection may be adjusted by adjusting an included angle between the two lateral sides of the isosceles triangle such that the focal length of the projection matches with an focal length of the elliptical arc surface (i.e., such that the projection and the elliptical arc surface have the common focal point).

As shown in FIG. 6, a Fresnel lens 303, which is equivalent to a convex lens, includes a third elliptical arc surface 3031 at the center and third projections 3032 between two adjacent concentric circles.

As shown in FIG. 7, a Fresnel lens 304, which is equivalent to a concave lens, includes a fourth elliptical arc surface 3041 at the center and fourth projections 3042 between two adjacent concentric circles.

The Fresnel lens having such simplified configuration is easy to be operated and has a low manufacturing cost.

As for a display substrate where a Fresnel lens layer is provided on a pixel layer 20, as shown in FIGS. 3 and 4, another embodiment of the present disclosure provides a method of manufacturing the display substrate comprising the following steps S1 to S4.

Step S1: coating a transparent resin on a base substrate 10 on which the pixel layer 20 is provided, to form a transparent resin layer, wherein a refractive index of the transparent resin layer is greater than a refractive index of the pixel layer 20.

It is understood that a method of manufacturing the pixel layer 20 belongs to prior art and is not described in detailed.

Step S2: forming a Fresnel lens layer by performing a mold-pressing process on the transparent resin layer by using a mold that has a shape corresponding to a shape of the Fresnel lens.

For example, in order to reduce difficulty in manufacturing process and save produce cost, a mold that corresponds to the Fresnel lens 303 or 304 as shown in FIG. 6 or 7 may be used for performing a hot-pressing process on the transparent resin layer to manufacture the Fresnel lens 303 or 304 as shown in FIG. 6 or 7.

Step S3: coating sealing glue 50 on the base substrate 10 on which the Fresnel lens layer is formed, in an example the sealing glue 50 is located around the pixel layer 20; selection and coating of the sealing glue belong to prior art and are not described in detailed.

Step S4: assembling the base substrate 10 which is coated with the sealing glue 50 and a packaging substrate 40.

Alignment between the base substrate 10 and the packaging substrate 40 may be performed by means of an alignment tool, thereby assembling them into a cell.

Optionally, a curing step may be continuously performed to the sealing glue of the assembled display substrate to form the final display substrate, which is not described in detailed herein.

As shown in FIG. 4, as for the display substrate where the Fresnel lens layer is disposed on a packaging substrate 40, a still embodiment of the present disclosure provides a method of manufacturing the display substrate comprising following steps S1' to S4'.

Step S1': coating sealing glue 50 on a base substrate 10 on which a pixel layer 20 is formed, in a example the sealing glue 50 is located at a periphery of or around the pixel layer 20.

It is understood that a method of manufacturing the pixel layer 20 belongs to prior art and is not described in detailed; and selection and coating of the sealing glue also belong to prior art and are not described in detailed.

Step S2': assembling the packaging substrate 40 and the base substrate 10 which is coated with the sealing glue 50.

Alignment between the base substrate 10 and the packaging substrate 40 may be performed by means of an alignment tool, thereby assembling them into a cell.

Step S3': manufacturing a Fresnel lens layer, and forming a protective layer 60 on the Fresnel lens layer.

Specifically, a sheet is formed from a polyolefin material by an injection-molded process. The sheet has a flat surface at a side and is formed with concentric circles at the other side opposite to the side, which are arranged one by one with diameters thereof gradually increasing, and is provided with projections between two adjacent concentric circles. The thickness of the Fresnel lens, diameters of the concentric circles and curvature of the projection may be controlled such that the focal point of the Fresnel lens is located at the pixel layer 20, i.e., within the plane where the pixel layer 20 is located.

Then, the protective layer 60 is coated on the Fresnel lens layer. Material for forming the protective layer 60 has a refractive index not less than a refractive index of a material for forming the Fresnel lens (i.e., a refractive index of the material for forming the Fresnel lens layer). In this configuration, light from the pixel layer 20 may be refracted and emitted from the protective layer 60; meanwhile, the Fresnel lens layer may be protected.

Step S4': attaching the Fresnel lens layer onto the packaging substrate 40.

Specifically, the Fresnel lens layer separately formed in step S3' is attached onto the packaging substrate 40 such that the sub-pixels 201 of each of the pixel units in the pixel layer 20 are located within the focal plane of the corresponding Fresnel lens, thereby forming a display substrate.

Of course, the display substrate may further include other functional layer(s), which is/are not described in detailed.

A further embodiment provides a display device comprising the above display substrate.

The display device may be a mobile phone, a tablet computer, a television, a display, a notebook computer, a digital photo frame, a navigator or products or components that have a display function. Implementation of the display device may be made by those skilled in the art with reference to the above embodiments and is not described in detailed.

It is understood that the above embodiments are merely exemplary embodiments used for setting forth principles of the present disclosure and scope of the present disclosure will not be limited to those. Any modification and improvement may be made within the spirit and scope of the present disclosure by those skilled in the art and shall be included in the protective scope of the present invention.

The invention claimed is:

1. A display substrate comprising a base substrate and a pixel layer disposed on the base substrate, the pixel layer comprising a plurality of pixel units distributed in a matrix array;
wherein the display substrate further comprises a Fresnel lens layer including a plurality of Fresnel lenses; and the pixel units each are located at a position within a focal plane of at least one of the Fresnel lenses;
wherein the Fresnel lens layer comprises a plurality of Fresnel lenses and each of the Fresnel lenses comprises:
a plurality of concentric circles at one side of the Fresnel lens layer, the plurality of concentric circles comprising an elliptical arc surface at a central position and projections located between two adjacent ones of concentric circles; and
a flat surface located at the other side of the Fresnel lens layer opposite to the side of the Fresnel lens layer;
wherein a vertical cross section of each of the projections comprises two lateral sides of an isoceles triangle and an angular bisector of an apex angle between the two lateral sides of the isoceles triangle is perpendicular to the Fresnel lens layer.

2. The display substrate according to claim 1, wherein each of the pixel units comprises a plurality of sub-pixels, and each of the sub-pixels corresponds to one of the Fresnel lenses and is located at a position within the focal plane of the corresponding Fresnel lens.

3. The display substrate according to claim 1, wherein each of the Fresnel lenses is equivalent to a concave lens or a convex lens.

4. The display substrate according to claim 1, wherein the Fresnel lens layer is disposed on the pixel layer and a packaging substrate is provided on the Fresnel lens layer.

5. The display substrate according to claim 1, wherein a packaging substrate is provided on the pixel layer and the Fresnel lens layer is provided on the packaging substrate.

6. The display substrate according to claim 5, further comprising a protective layer on a side of the Fresnel lens layer apart from the packaging substrate and a material of the protective layer has a refractive index not less than a refractive index of a material of the Fresnel lenses.

7. The display substrate according to claim 4, further comprising sealing glue used for sealing the base substrate and the packaging substrate; wherein the sealing glue is located around the pixel layer.

8. The display substrate according to claim 1, wherein each of the projections comprises a sawtooth-shaped arc surface, and the elliptical arc surface and the sawtooth-shaped arc surface together form a curved surface of the concave lens or the convex lens.

9. A display device comprising the display substrate according to claim 1.

10. The display substrate according to claim 5, further comprising sealing glue used for sealing the base substrate and the packaging substrate; wherein the sealing glue is located around the pixel layer.

11. The display substrate according to claim 2, wherein the Fresnel lens layer comprises a plurality of Fresnel lenses and each of the Fresnel lenses comprises:
a plurality of concentric circles at one side of the Fresnel lens layer, the plurality of concentric circles comprising an elliptical arc surface at a central position and projections located between two adjacent ones of concentric circles; and
a flat surface located at the other side of the Fresnel lens layer opposite to the side of the Fresnel lens layer.

12. The display substrate according to claim 3, wherein the Fresnel lens layer comprises a plurality of Fresnel lenses and each of the Fresnel lenses comprises:
a plurality of concentric circles at one side of the Fresnel lens layer, the plurality of concentric circles comprising an elliptical arc surface at a central position and projections located between two adjacent ones of concentric circles; and
a flat surface located at the other side of the Fresnel lens layer opposite to the side of the Fresnel lens layer.

13. The display substrate according to claim 4, wherein the Fresnel lens layer comprises a plurality of Fresnel lenses and each of the Fresnel lenses comprises:
a plurality of concentric circles at one side of the Fresnel lens layer, the plurality of concentric circles comprising an elliptical arc surface at a central position and projections located between two adjacent ones of concentric circles; and
a flat surface located at the other side of the Fresnel lens layer opposite to the side of the Fresnel lens layer.

14. The display substrate according to claim 5, wherein the Fresnel lens layer comprises a plurality of Fresnel lenses and each of the Fresnel lenses comprises:
   a plurality of concentric circles at one side of the Fresnel lens layer, the plurality of concentric circles comprising an elliptical arc surface at a central position and projections located between two adjacent ones of concentric circles; and
   a flat surface located at the other side of the Fresnel lens layer opposite to the side of the Fresnel lens layer.

15. The display substrate according to claim 6, wherein the Fresnel lens layer comprises a plurality of Fresnel lenses and each of the Fresnel lenses comprises:
   a plurality of concentric circles at one side of the Fresnel lens layer, the plurality of concentric circles comprising an elliptical arc surface at a central position and projections located between two adjacent ones of concentric circles; and
   a flat surface located at the other side of the Fresnel lens layer opposite to the side of the Fresnel lens layer.

\* \* \* \* \*